(12) United States Patent
Galera et al.

(10) Patent No.: US 7,960,211 B2
(45) Date of Patent: Jun. 14, 2011

(54) SEMICONDUCTOR SYSTEM-IN-PACKAGE AND METHOD FOR MAKING THE SAME

(75) Inventors: Manolito Galera, Singapore (SG);
Leocadio Morona Alabin, Singapore (SG)

(73) Assignee: Fairchild Semiconductor Corporation, CA (US)

( * ) Notice: Subject to any disclaimer, the term of this patent is extended or adjusted under 35 U.S.C. 154(b) by 279 days.

(21) Appl. No.: 12/178,043

(22) Filed: Jul. 23, 2008

(65) Prior Publication Data

US 2010/0019363 A1 Jan. 28, 2010

(51) Int. Cl.
*H01L 23/495* (2006.01)
*H01L 21/56* (2006.01)

(52) U.S. Cl. ........ 438/107; 257/686; 257/690; 257/692; 257/723; 257/724; 257/777; 257/E23.039; 257/E23.07; 257/E23.071; 257/E23.078; 257/E21.502; 438/109; 438/611

(58) Field of Classification Search .................. 257/686, 257/690, 692, 723, 724, 777, E23.039, E23.07, 257/E23.071, E23.078, E21.502; 438/109, 438/611, 107
See application file for complete search history.

(56) References Cited

U.S. PATENT DOCUMENTS

| | | | |
|---|---|---|---|
| 6,407,456 B1 * | 6/2002 | Ball | 257/777 |
| 6,861,288 B2 | 3/2005 | Shim et al. | |
| 2004/0145039 A1 * | 7/2004 | Shim et al. | 257/678 |
| 2005/0184376 A1 | 8/2005 | Salmon | |
| 2006/0220256 A1 * | 10/2006 | Shim et al. | 257/777 |
| 2007/0052076 A1 * | 3/2007 | Ramos et al. | 257/676 |
| 2007/0108583 A1 * | 5/2007 | Shim et al. | 257/686 |
| 2007/0184376 A1 | 8/2007 | Lee et al. | |
| 2008/0001272 A1 | 1/2008 | Chu | |
| 2008/0029858 A1 * | 2/2008 | Merilo et al. | 257/668 |
| 2008/0036063 A1 * | 2/2008 | Kim | 257/686 |
| 2008/0185695 A1 * | 8/2008 | Kim et al. | 257/670 |
| 2009/0230531 A1 * | 9/2009 | Do et al. | 257/685 |

* cited by examiner

*Primary Examiner* — Eugene Lee
*Assistant Examiner* — Peniel M Gumedzoe
(74) *Attorney, Agent, or Firm* — Kirton & McConkie; Kenneth E. Horton (57) ABSTRACT

Semiconductor devices that contain a system in package and methods for making such packages are described. The semiconductor device with a system in package (SIP) contains a first IC die, passive components, and discrete devices that are contained in a lower level of the package. The SIP also contains a second IC die that is vertically separated from the first IC die by an array of metal interposers, thereby isolating the components of the first IC die from the components of the second IC die. Such a configuration provides more functionality within a single semiconductor package while also reducing or eliminating local heating in the package. Other embodiments are also described.

24 Claims, 6 Drawing Sheets

SEMICONDUCTOR SYSTEM-IN-PACKAGE AND METHOD FOR MAKING THE SAME

FIELD

This application relates generally to semiconductor devices and methods for making such devices. More specifically, this application describes semiconductor packages that contain a system-in-package (SIP) and methods for making such packages.

BACKGROUND

Semiconductor packages are well known in the art. Often, these packages may include one or more semiconductor devices, such as an integrated circuit ("IC") die, which may be connected to a die pad that is centrally formed in a lead frame. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

In most instances, each semiconductor package only contains a single die that contains the IC. Thus, the functionality of each semiconductor package is often limited to the functions of that particular IC which the die contains.

SUMMARY

This application relates to semiconductor devices that contain a system-in-package and methods for making such packages. The semiconductor device with a system-in-package (SIP) contains a first IC die, passive components, and discrete devices that are contained in a lower level of the package. The SIP also contains a second IC die that is vertically separated from the first IC die by an array of metal interposers, thereby isolating the components of the first IC die from the components of the second IC die. Such a configuration provides more functionality within a single semiconductor package while also reducing or eliminating local heating in the package.

BRIEF DESCRIPTION OF THE DRAWINGS

The following description can be better understood in light of the Figures, in which.

The Figures illustrate specific aspects of the semiconductor devices that contain a system-in-package and methods for making such packages. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor devices and associated methods of using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the IC industry, it could be used for and applied to other electronic devices like optoelectronic devices, solar cells, MEMS structures, lighting controls, power supplies, and amplifiers. As well, while the description below describes using two IC dies in the same semiconductor package, it could be configured to contain more than two, including 3 or more dies.

Some embodiments of the semiconductor devices that contain a SIP and methods for making such packages are shown in the Figures. In some embodiments, the semiconductor devices are provided in the form of a quad, flat no-lead (QFN) semiconductor package or a ball grid array (BGA) package. In other embodiments, the semiconductor devices can be provided in different forms of a semiconductor package.

Figure 1:
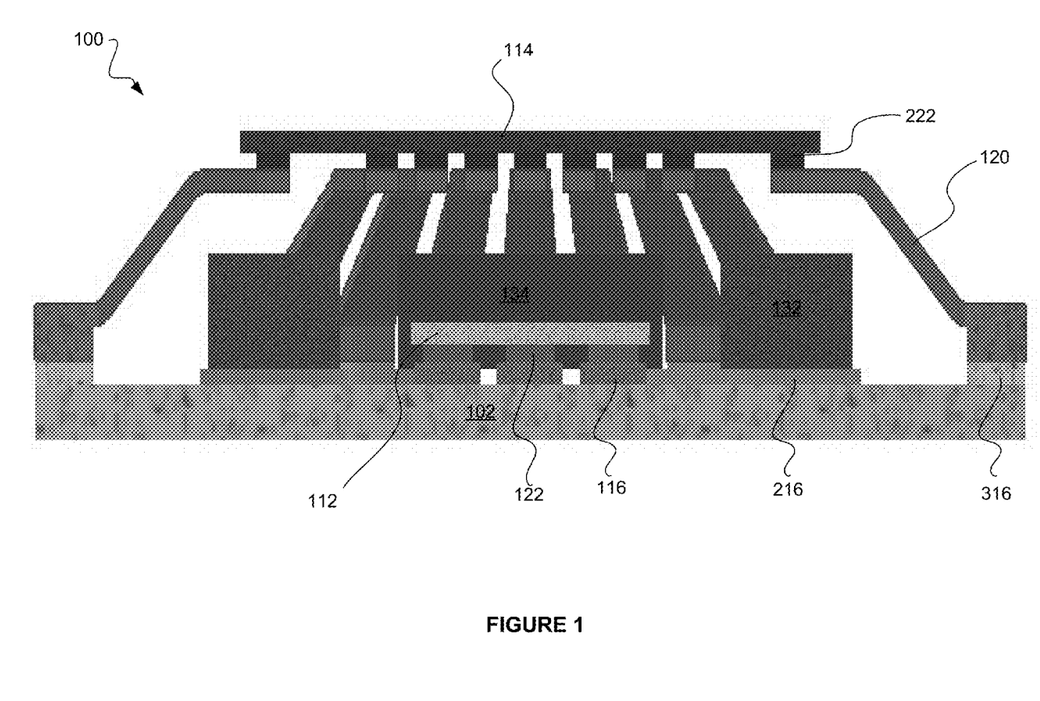
FIG. 1 shows some embodiments of a semiconductor package without encapsulation.
Figure 2:
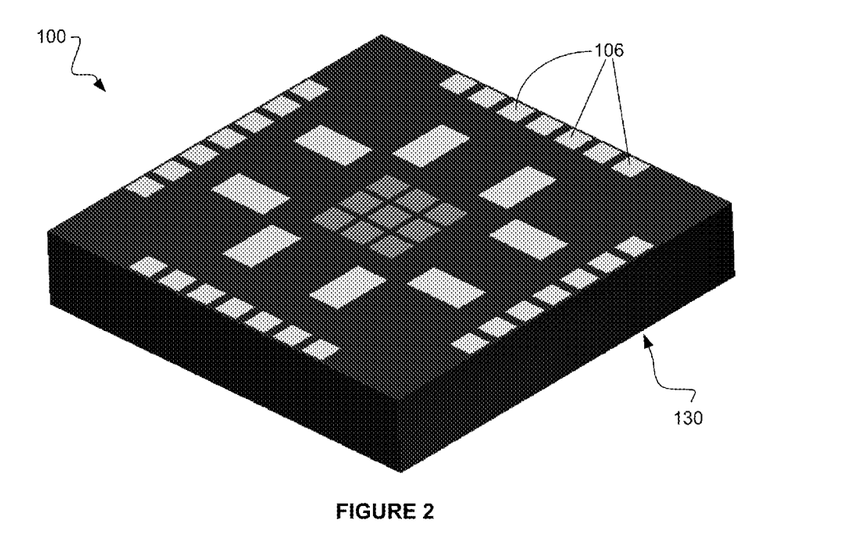
FIG. 2 shows a bottom view of some embodiments of a semiconductor package with encapsulation.
Figure 3:
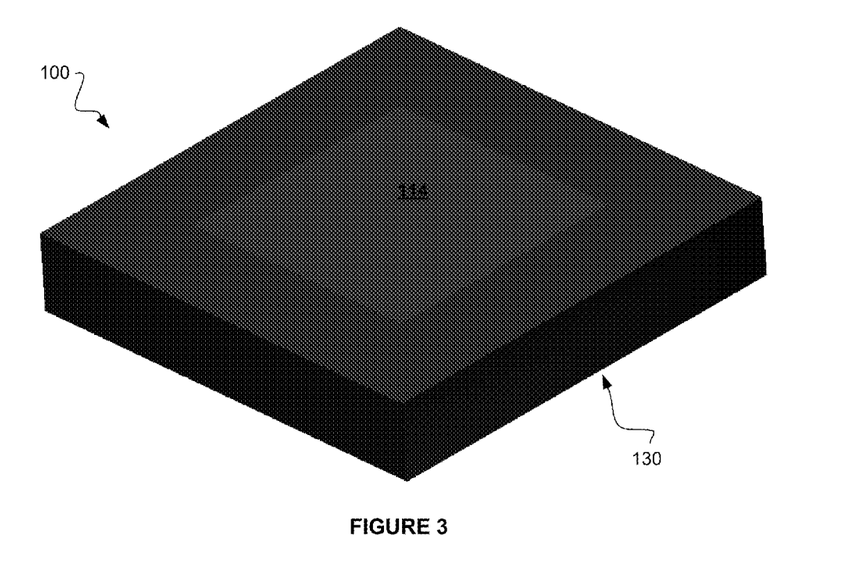
FIG. 3 shows a top view of some embodiments of a semiconductor package with encapsulation.

In the embodiments shown in FIG. 1 (a view with encapsulation), FIG. 2 (bottom view), and FIG. 3 (top view), the semiconductor package 100 contains a substrate 102, a plurality of terminals 106, a first die 112 containing a first IC device, a second die 114 containing a second IC device, stud bumps 122 and 222, land pads (116, 216, and 316), connectors 120, and an encapsulation 130. The semiconductor package 100 also contains a passive component(s) 132 and a discrete device(s) 134 that are located on the substrate 102.

The first IC device (in the first die 112) and the second IC device (in the second die 114) may be the same or different and may be any known integrated circuit in the art. Some non-limiting examples of these devices may include audio amplifier, LDO, logic driver, signal switch, or combinations thereof. In some embodiments, the first IC device comprises a LDO and the second IC device comprises an audio amplifier.

The package 100 can contain either a single discrete device 134 or multiple discrete devices 134. Any discrete device known in the art can be used in the package 100, including diodes, and/or transistors. Examples of the discrete devices include zener diodes, schottky diodes, small signal diodes, bipolar junction transistors ("BJT"), metal-oxide-semiconductor field-effect transistors ("MOSFET"), insulated-gate-bipolar transistors ("IGBT"), insulated-gate field-effect transistors ("IGFET"), or combinations thereof. In some embodiments, the discrete device 134 comprises a schottky diode and bipolar transistor for audio power application. In FIG. 1, the discrete device 134 is illustrated in the form of a surface mount package, but discrete devices in chip form can also be used.

The package 100 can also contain either a single passive component 132 or multiple passive components 132. Any passive component known in the art can be used in the package 100, including capacitors, inductors, resistors, filters, or combinations thereof. In some embodiments, the passive component 132 comprises a capacitor and resistor for audio amplifier application. In FIG. 1, the passive component 132 is illustrated in the form of a surface mount package, but passive components in chip form can also be used.

The semiconductor package 100 also contains a substrate 102 on which the other components of the semiconductor package are located. Any low cost, reusable substrate known in the art can be used, such as steel, stainless steel or any alloy known in the art. The substrate 102 can be configured with any shape and size consistent with its use in the semiconductor package 100. The substrate 102 can have any thickness that provides the needed support for the device. In some embodiments, such as where the substrate 102 comprises stainless steel, it may have a non-limiting thickness ranging from about 0.15 millimeters to about 0.25 millimeters.

In some embodiments, the substrate 102 has the shape illustrated in the Figures since it contains an area to which multiple land pads (116, 216, 316) can be attached. The bottom of the first die 112 can be then connected to the land pads 116. Due to the overlap of the surfaces of the die attach pad area and the first die 112, the die attach pad area can act as both a thermal and/or an electrical conductor. Such a configuration also permits the substrate 102 to dissipate the heat generated by the IC devices, increasing the efficiency of the heat dissipation from the semiconductor package 100. And the substrate 102 is also configured so that it can contain land pads 216 and 316 so that the land pads 216 can be used to attach the passive components 132 to the substrate 102 and so that the land pads 316 also be used bond or attach the second die 114 to the connectors 120, which are in turn, connected to substrate 102. (Suggest to remove this portion since substrate 102 won't be included in the final package)

In some embodiments, the land pads (116, 216, and 316) can also serve as leads for the semiconductor package. In these embodiments, the substrate 102 is removed or peeled-off after molding process but with the land pads (116, 216, and 316) retained on the molded body. Thus, the ends of the land pads (116, 216, and 316) serve as the respective terminals. Accordingly, the lay-out of the land pads (116, 216, and 316) and the terminals are substantially similar. In other embodiments, though, the land pads and the terminals are formed separate from each other and a redistribution layer can be used to change the lay-out from the land pads to the terminals.

In some embodiments, the land pads (116, 216, and 316) can comprise any bond pads known in the semiconductor art. For example, the land pads could comprise a metal stud and a reflowed solder material or metal deposit like Au, Ni, and Ag. To enhance the bond between the respective component to which they are attached and the substrate 102, the land pads (116, 216, and 316) may be formed with uneven surfaces so that the metal stud of the land pads tightly adheres to the substrate 102.

The land pages (116, 216, and 316) are configured to substantially match the components to which they are respectively attached. Accordingly, the land pads 116 can be configured to substantially match the parts of the first die to which they will be bonded, the land pads 216 can be configured to substantially match the passive component(s) 132 and the discrete device(s) 134 to which they will be bonded, and the land pads 316 can be configured to substantially match the connectors 120.

The semiconductor package 100 also contains connectors 120 that are used to connect the land pads 316 to the second die 114. In some embodiments, the connectors 120 comprise an array of metal strips that can be used as interposers. The metal strips used as connectors can contain any conductive metal or metal alloy that are similar to standard known in the art, including Cu, Cu alloy, Ni—Pd, or Ni—Pd—Au. In some embodiments, the metal strips comprise Cu.

The array of metal strips forming the connectors 120 can be configured to substantially match the desired connection points in the second die 114 and the land pads 316. Thus, for the semiconductor package 100 illustrated in FIG. 1, the array of Cu strips are configured to contain a first portion that extends away from the land pads 316. Thus, this first portion is substantially similar in size to the land pads 316. The connectors 120 also contain a second portion that extends from the first portion towards the area above the first die 112 (on which the second die 114 rests). In the embodiments depicted in FIGS. 1-3, the second portion of the connectors 120 can be given a finger-like configuration.

The first and second IC dies, the upper surface of the substrate 102, the connectors 120, the passive component(s), and the discrete device(s) can be encapsulated in any molding material 130 known in the art, as shown in FIGS. 2-3. In some embodiments, the molding material can comprise an epoxy molding compound, a thermoset resin, a thermoplastic material, or potting material. In other embodiments, the molding material comprises an epoxy molding compound. In FIG. 1, the molding material 130 is not shown to better illustrate the internal components of semiconductor package 100.

Figure 4:
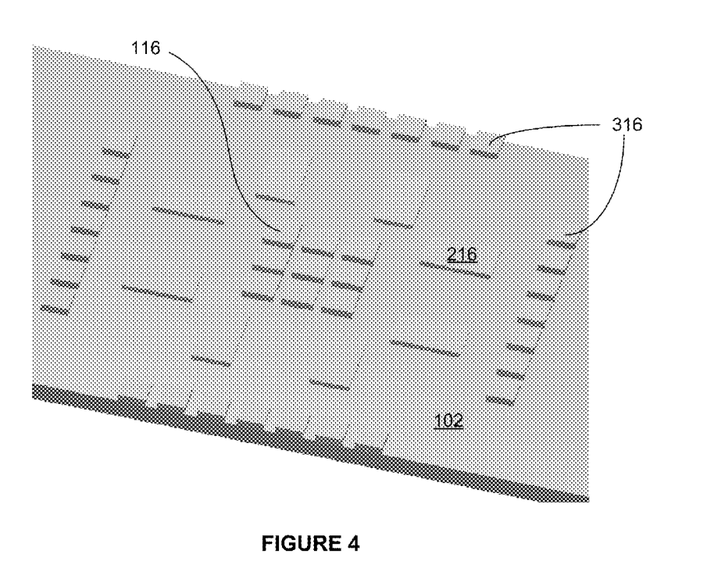
FIGS. 4-11 depict some embodiments of the methods for manufacturing a semiconductor package.

The semiconductor package 100 can be made using any known process that provides the structures described above and/or as illustrated in FIGS. 1-3. In some embodiments, the methods described herein can be used. The method begins, as illustrated in FIG. 4, by providing the substrate 102. The substrate can be provided by metal stamping or etching a frame of the desired material (i.e., stainless steel) to contain multiple lands or terminals. Each of the individual substrates can be separated by being removed (i.e., peeled-off) after the package 100 has been formed.

As shown in FIG. 4, the land pads 116, 216, and 316 are next formed on the substrate 102 using any process known in art. In some embodiments, the land pads can be formed by depositing the material and then etching the undesired portions of that material, thereby forming the land pads with the desired shape. Of course, for the land pads 216, less material is etched than for landing pads 116 and 316 so that larger land pads are formed, as illustrated in FIG. 4.

Next, or at the same time, the passive component 132(s) and/or the discrete device(s) 134 are manufactured using any known processes. In some embodiments, the passive component 132 and the discrete device 134 devices can be manufactured separately. But in other embodiments, the passive component 132 and/or the discrete device 134 are manufactured at the same time by using known semiconductor processes such as die attach and wirebond.

Next, or at the same time, the first die 112 and the second die 114 containing their IC devices are manufactured using any known processes. In some embodiments, the first and second IC devices can be manufactured separately in the first and second dies. But in other embodiments, the first and second IC devices are manufactured in their respective dies at the same time. And in some embodiments, the first and second dies, the passive component, and the discrete device are all manufactured substantially at the same time.

Figure 5:
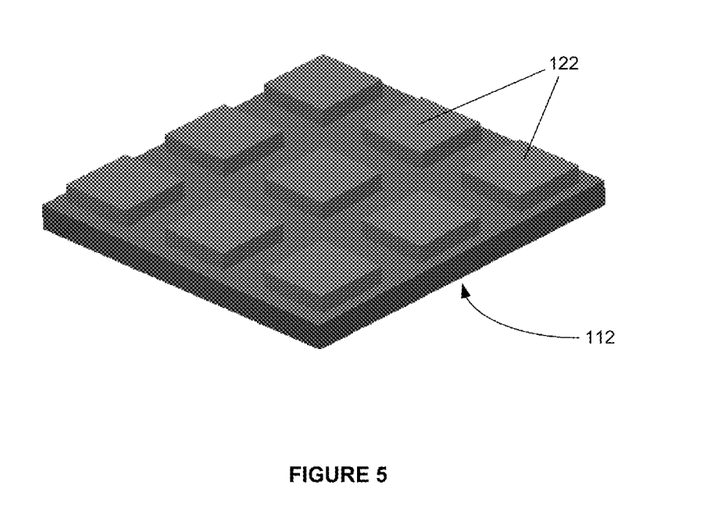
Figure 7:
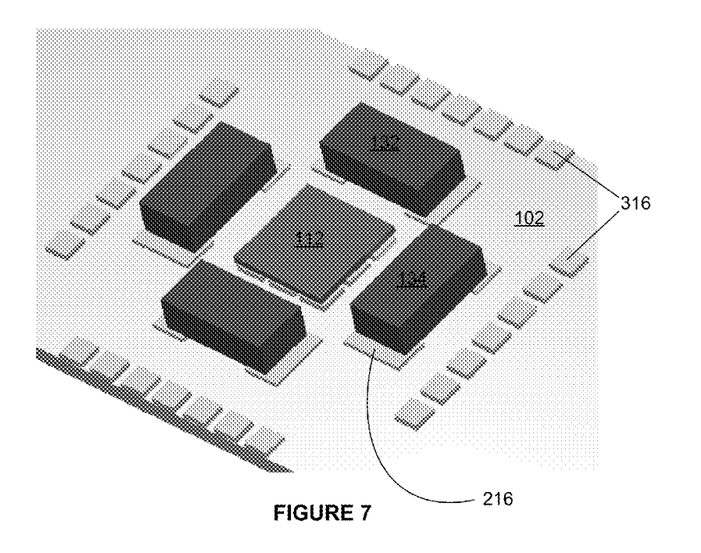

Next, as shown in FIG. 7, the first die 112 containing the first IC device is attached to the land pads 116 using any known process. In some embodiments, this process includes a flip-chip process with solder bumping, which may include the use of solder bumps, balls, studs, and combinations thereof along with a solder paste, followed by a cure and reflow process. An example of the bumps 122 that can be formed in this process (for the first IC die 112) are illustrated in FIG. 5.

In other embodiments, the attachment process includes a flip chip process with the use of a conductive adhesive between the substrate lands 116 and the first IC device. The conductive adhesive may be, for example, a conductive epoxy, a conductive film, a screen printable solder paste, or a solder material, such as a lead-containing solder or a lead-free solder.

Figure 6:
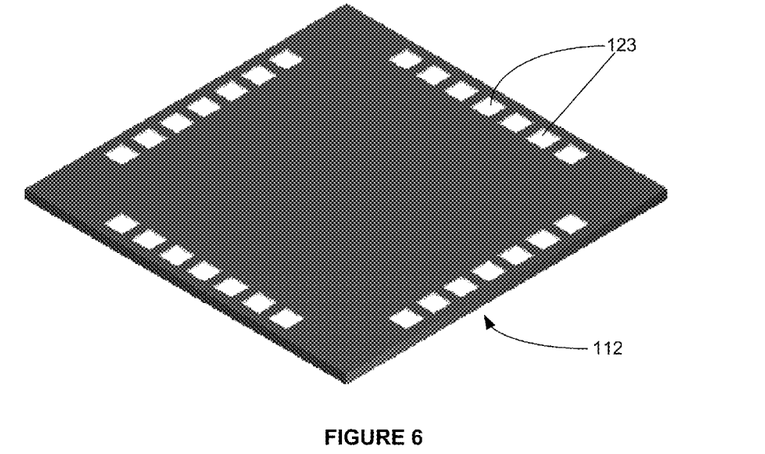

In yet other embodiments, this attachment is performed by any wirebonding process known in the art. As an example of the wirebonding, the first IC die 112 can be provided with contacts pads 123 near the exterior of the die as shown in FIG. 6. After that die is attached to the substrate 102, wirebonds are formed from the contact pads 123 to the desired connection points of the substrate 102 to form the electrical connection.

The passive component(s) 132 and the discrete device(s) 134 are then attached to the substrate through the land pads 216 using any known process, as shown in FIG. 7. This process can instead be performed before or at the same time as the attachment process for the first IC die 112. The passive component 132 and the discrete device 134 can themselves be attached at the same time or at different times. The passive component 132 and the discrete device 134 can be attached directly to the land pads 216 if they are in the form of a surface mount package, as illustrated in the Figures. But if the passive component 132 and the discrete device 134 are in chip form, they can be attached by either a bumping or a wirebonding process.

Figure 8:
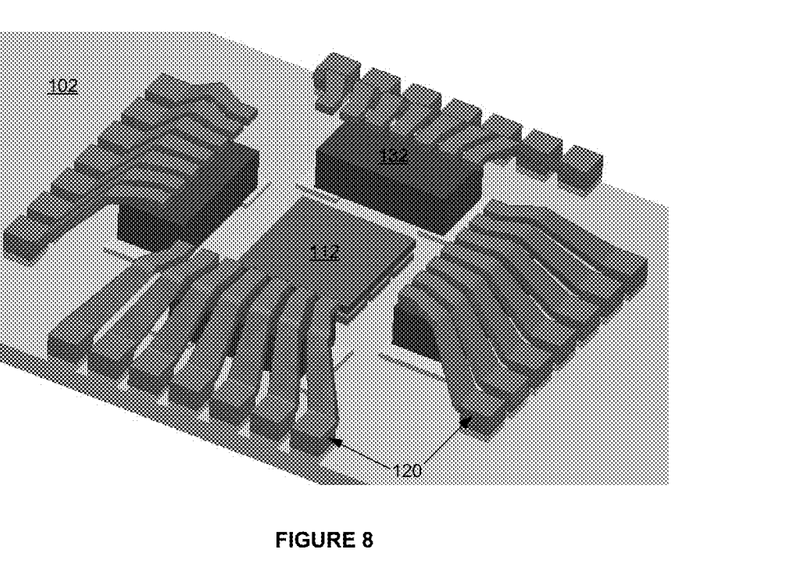

Next, the connectors 120 are formed using any known process in the art. Examples of these processes include a metal stamping or etching process. In some embodiments, the connectors are formed using a metal stamping or etching process. Next, as shown in FIG. 8, the connectors 120 can be attached to those land pads which remain exposed after the first die 112, i.e., land pads 316. This process can be performed using any known technique, including solder or adhesive dispensing or printing. The array of connectors is then attached to the land pads and undergoes solder reflow or adhesive curing.

Figure 9:
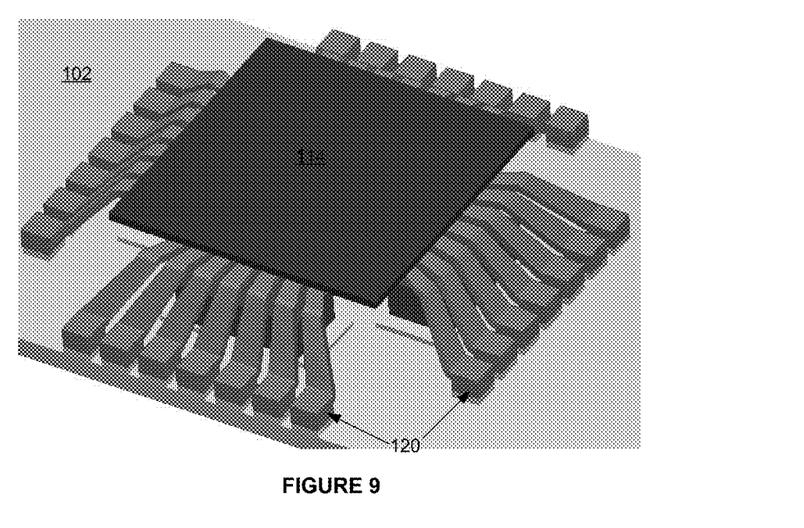

The second (or upper) die 114 is then attached to the connectors 120 above the first IC die 112. This process can be carried out using any known process. In some embodiments, this processes includes a flip-chip process with solder bumping, which may include the use of solder bumps, balls, studs, and combinations thereof along with a solder paste, followed by a cure and reflow process. An example of the structure resulting after the flip chip process is illustrated in FIG. 9. In other embodiments, the attached process includes a flip chip process with the use of a conductive adhesive between the substrate 102 and the second IC device. The conductive adhesive may be, for example, a conductive epoxy, a conductive film, a screen printable solder paste, or a solder material, such as a lead-containing solder or a lead-free solder.

Figure 10:
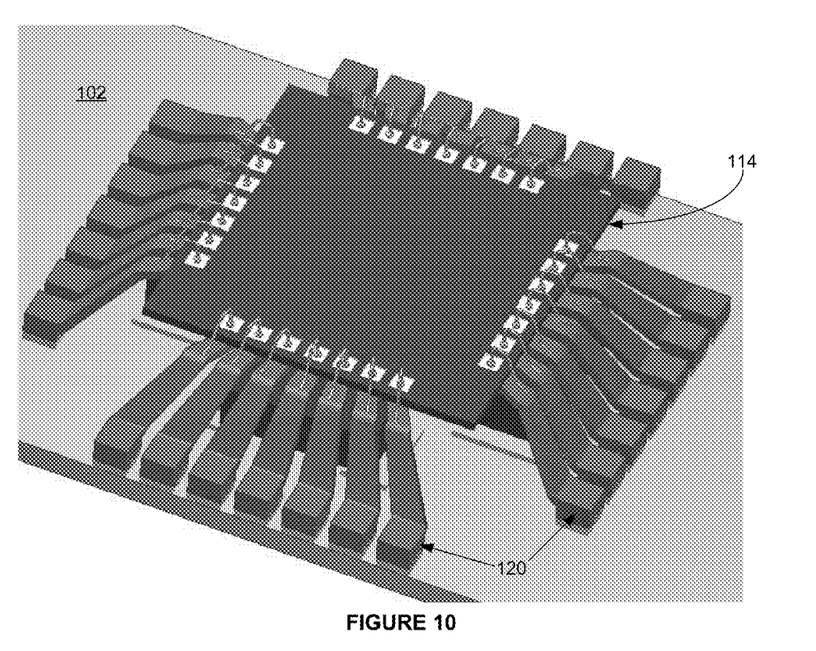
Figure 11:
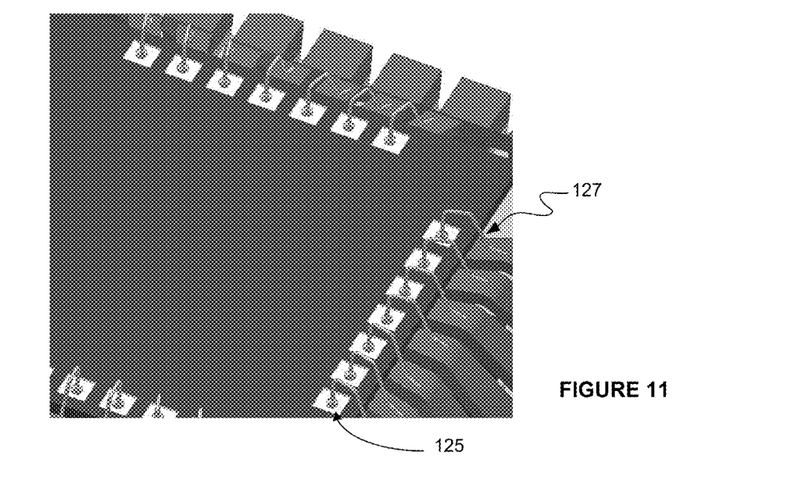

In yet other embodiments, this attachment of the second IC die 114 to the connectors 120 is performed by any wirebonding process known in the art. As an example of the wirebonding process, the second IC die 114 can be provided with contacts pads 125 near the exterior of the die as shown in FIG. 10 (with a close-up of the wirebonding shown in FIG. 11). After that die 114 is attached to the connectors 120, wirebonds 127 are formed as known in the art from the contact pads 125 to the connectors 120 to form the electrical connection.

After the second IC die 114 has been attached to the connectors 120, the molding material 130 is then formed around the substrate 102, first and second dies, the connectors, the passive component 132, and the discrete device 134 by any known encapsulation process, including potting, transfer molding, or injection. In some embodiments, the encapsulation process does not require any underfill. The resulting semiconductor package 100 (such as those illustrated in FIGS. 1-3) is then optionally marked and singulated using processes known in the art.

The semiconductor packages formed from this process contain two dies with IC devices that are isolated from each other because the molding material is contained between them. This configuration serves to separates the dies from each other, as well as separating the dies from the passive component and the discrete device. In this configuration, since there is no direct contact between the dies, their respective thermal stability is easier to maintain and heat is dissipated quicker. At the same time, the semiconductor packages contain a complete system in the package and, therefore, have an expanded functionality.

In some embodiments, the semiconductor packages can be configured to contain more than 2 stacked dies. The additional dies can be incorporated by including additional land pads on which additional connectors can be located. Then, the additional dies can be attached to the additional connectors by using an attachment process similar to those described above.

In some embodiments, the semiconductor packages can be configured to contain a different arrangement of components. In these embodiments, the semiconductor packages contain a first die with an IC on the first level (near the substrate). But the semiconductor packages do not contain a second die with an IC at the upper level. Instead, the passive component(s) and discrete device(s) are located at the upper level and are supported by an array of connectors.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for making semiconductor package, comprising:
   providing a substrate containing multiple land pads;
   connecting a first IC die to a first portion of the lands pads;
   connecting a passive component and a discrete device to a second portion of the land pads;
   connecting an array of connectors to a third portion of the land pads;

providing a second IC die over the first IC die;
connecting the second IC die to the array of connectors without contacting the second IC die to the first IC die, wherein the second IC die is supported by the connectors; and
removing the substrate.

2. The method of claim 1, wherein the connectors contain a first portion extending away from the third portion of the land pads and a second portion extending towards the second IC die.

3. The method of claim 1, further comprising connecting the first IC die to the first portion of the land pads using a bumping process and connecting the second die to the connectors using a bumping process.

4. The method of claim 1, further comprising encapsulating a molding material around the connectors and the first and second dies.

5. A method for making a semiconductor system in a package, comprising:
providing a substrate;
forming multiple land pads on the substrate by a deposition and etch procedure;
connecting a first die to a first inner portion of the land pads;
connecting a passive component and a discrete device connected to a second, inner portion of the land pads;
connecting an array of connectors to a third portion of the land pads located around the periphery of the substrate, the connectors containing a first portion extending away from the third portion of the land pads and a second portion extending towards the middle of the substrate;
providing a second die over the first die;
connecting the second die to the array of connectors, wherein the second die rests on and is supported by the connectors without contacting the first die;
encapsulating a molding material around the connectors and the first and second dies without underfilling; and
removing the substrate.

6. The method of claim 5, further comprising connecting the first die to the first portion of the land pads using a bumping process and connecting the second die to the connectors using a bumping process.

7. The method of claim 5, further comprising connecting the first die to the first portion of the land pads using a wirebonding process and connecting the second die to the connectors using a wirebonding process.

8. A method for making semiconductor package, comprising:
providing a substrate containing multiple land pads;
connecting a first IC die to a first portion of the lands pads using a wirebonding process;
connecting a passive component and a discrete device to a second portion of the land pads;
connecting an array of connectors to a third portion of the land pads using a wirebonding process;
providing a second IC die over the first IC die;
connecting the second IC die to the array of connectors without contacting the second IC die to the first IC die, wherein the second IC die is supported by the connectors; and
removing the substrate.

9. The method of claim 1, wherein the second portion of the land pads is located between the first portion and the third portion of the land pads.

10. The method of claim 9, wherein the first portion of the land pads is located on a central region of the substrate and the third portion of the land pads is located on a periphery of the substrate.

11. The method of claim 1, further comprising connecting the first die to the first portion of the land pads using a wirebonding process and connecting the second die to the connectors using a wirebonding process.

12. The method of claim 1, wherein the second die is isolated from the first die.

13. The method of claim 1, wherein the multiple land pads operate as external leads for the package.

14. The method of claim 4, wherein the encapsulation is performed without underfilling.

15. The method of claim 5, wherein the second portion of the land pads is located between the first portion and the third portion of the land pads.

16. The method of claim 15, wherein the first portion of the land pads is located on a central region of the substrate and the third portion of the land pads is located on a periphery of the substrate.

17. The method of claim 5, wherein the second die is isolated from the first die.

18. The method of claim 5, wherein the multiple land pads operate as external leads for the package.

19. The method of claim 8, wherein the second portion of the land pads is located between the first portion and the third portion of the land pads.

20. The method of claim 19, wherein the first portion of the land pads is located on a central region of the substrate and the third portion of the land pads is located on a periphery of the substrate.

21. The method of claim 8, wherein the second die is isolated from the first die.

22. The method of claim 8, wherein the multiple land pads operate as external leads for the package.

23. The method of claim 8, wherein the package contains multiple passive components.

24. The method of claim 8, wherein the package contains multiple discrete devices.

* * * * *